(12) United States Patent
Jung

(10) Patent No.: US 8,238,180 B2
(45) Date of Patent: Aug. 7, 2012

(54) SEMICONDUCTOR MEMORY APPARATUS

(75) Inventor: Jong Ho Jung, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 204 days.

(21) Appl. No.: 12/840,253

(22) Filed: Jul. 20, 2010

(65) Prior Publication Data

US 2011/0267911 A1 Nov. 3, 2011

(30) Foreign Application Priority Data

Apr. 30, 2010 (KR) .................. 10-2010-0040547

(51) Int. Cl.
*G11C 7/00* (2006.01)
(52) U.S. Cl. ................. 365/201; 365/189.011
(58) Field of Classification Search .............. 365/201, 365/189.011
See application file for complete search history.

(56) References Cited

U.S. PATENT DOCUMENTS

| 7,477,083 B2 | 1/2009 | Fujisawa et al. |
| 7,528,626 B2 | 5/2009 | Kim |
| 7,853,842 B2 * | 12/2010 | Kim et al. .................. 714/721 |
| 2007/0132493 A1 | 6/2007 | Fujisawa et al. |
| 2007/0148796 A1 | 6/2007 | Nakamura et al. |
| 2008/0219068 A1 | 9/2008 | Kim et al. |

FOREIGN PATENT DOCUMENTS

| JP | 2002-367400 A | 12/2002 |
| JP | 2007-116574 | 5/2007 |
| JP | 2007-123987 | 5/2007 |
| JP | 2008-219865 | 9/2008 |
| JP | 2008-228276 | 9/2008 |
| KR | 100853466 B1 | 8/2008 |

\* cited by examiner

*Primary Examiner* — Son Dinh
*Assistant Examiner* — Nam Nguyen
(74) *Attorney, Agent, or Firm* — William Park & Associates Ltd.

(57) ABSTRACT

A semiconductor memory apparatus includes: a line calibration unit configured to selectively output one signal from the group of code signals for calibrating termination resistance values and test mode signals for testing a chip of the semiconductor memory apparatus to a common global line based on the level of a line calibration signal.

11 Claims, 3 Drawing Sheets

US 8,238,180 B2

SEMICONDUCTOR MEMORY APPARATUS

CROSS-REFERENCES TO RELATED APPLICATION

The present application claims priority under 35 U.S.C. §119(a) to Korean Application No. 10-2010-0040547, filed on Apr. 30, 2010, in the Korean Intellectual Property Office, which is incorporated herein by reference in its entirety as if set forth in full.

BACKGROUND

1. Technical Field

The present invention relates to a semiconductor integrated circuit, and more particularly, to a semiconductor memory apparatus.

2. Related Art

As semiconductor memory devices become more highly integrated and high-performing, efforts to reduce the chip area are taking place with respect to semiconductor memory device manufacturing processes and circuit arrangement methods (i.e., layout), as well as in the area of circuits.

FIG. 1 is a block diagram schematically illustrating a conventional semiconductor memory apparatus.

Referring to FIG. 1, the conventional semiconductor memory apparatus 10 includes an impedance calibration block (a ZQ calibration block) 12. The impedance calibration block 12 generates first and second code signals (PCODE<0:M-1> and NCODE<0:M-1>, respectively), which vary depending on PVT (process, voltage and temperature) conditions, and calibrates termination resistance values of input/output blocks 14 by using first code signals and second code signals generated as a result of impedance calibration. Since the first code signals PCODE<0:M-1> and the second code signals NCODE<0:M-1> have a predetermined number of bits, a plurality of lines are required.

Meanwhile, the semiconductor memory apparatus 10 has lines for a plurality of test mode signals TM<0:N-1> used for testing a chip, in addition to lines for the first code signals PCODE<0:M-1> and the second code signals NCODE<0:M-1>. Accordingly, the semiconductor memory apparatus 10 uses numerous global lines, resulting in the problem of increased chip area.

SUMMARY

Accordingly, various exemplary embodiments of the invention described herein may provide a semiconductor memory apparatus with a reduced area.

In one embodiment of the present invention, a semiconductor memory apparatus includes: a line calibration unit configured to selectively output one code signal for calibrating termination resistance values or one test mode signal for testing semiconductor memory chips, to a common global line based on the level of a line calibration signal.

In another embodiment of the present invention, semiconductor memory apparatus includes a common global line control block configured to output one code signal or one test mode signal to a common global line in response to a line calibration signal inputted from outside of the semiconductor memory apparatus, and to control the signal outputted to the common global line to be inputted to a corresponding block in response of the line calibration signal.

BRIEF DESCRIPTION OF THE DRAWINGS

Features, aspects, and embodiments are described in conjunction with the attached drawings, in which.

DETAILED DESCRIPTION

Exemplary embodiments of a semiconductor memory apparatus according to the present invention are described below in detail with reference to the accompanying drawings.

Figure 1:
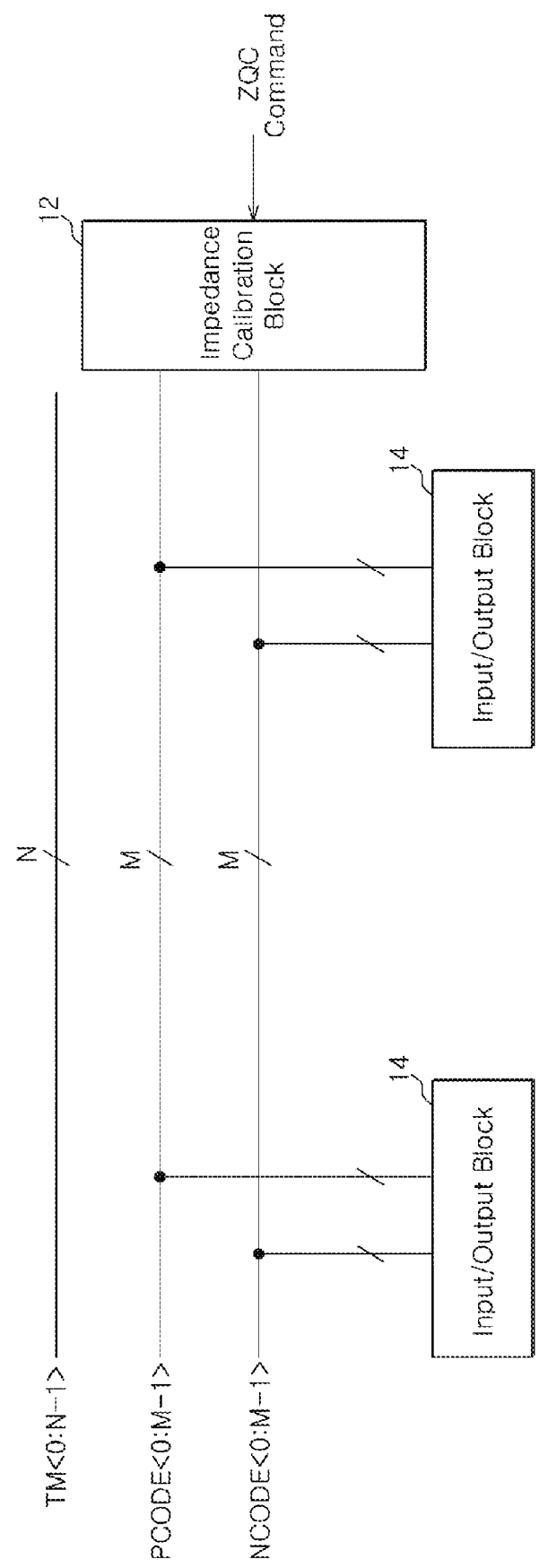
FIG. 1 is a block diagram schematically illustrating a conventional semiconductor memory apparatus.
Figure 2:
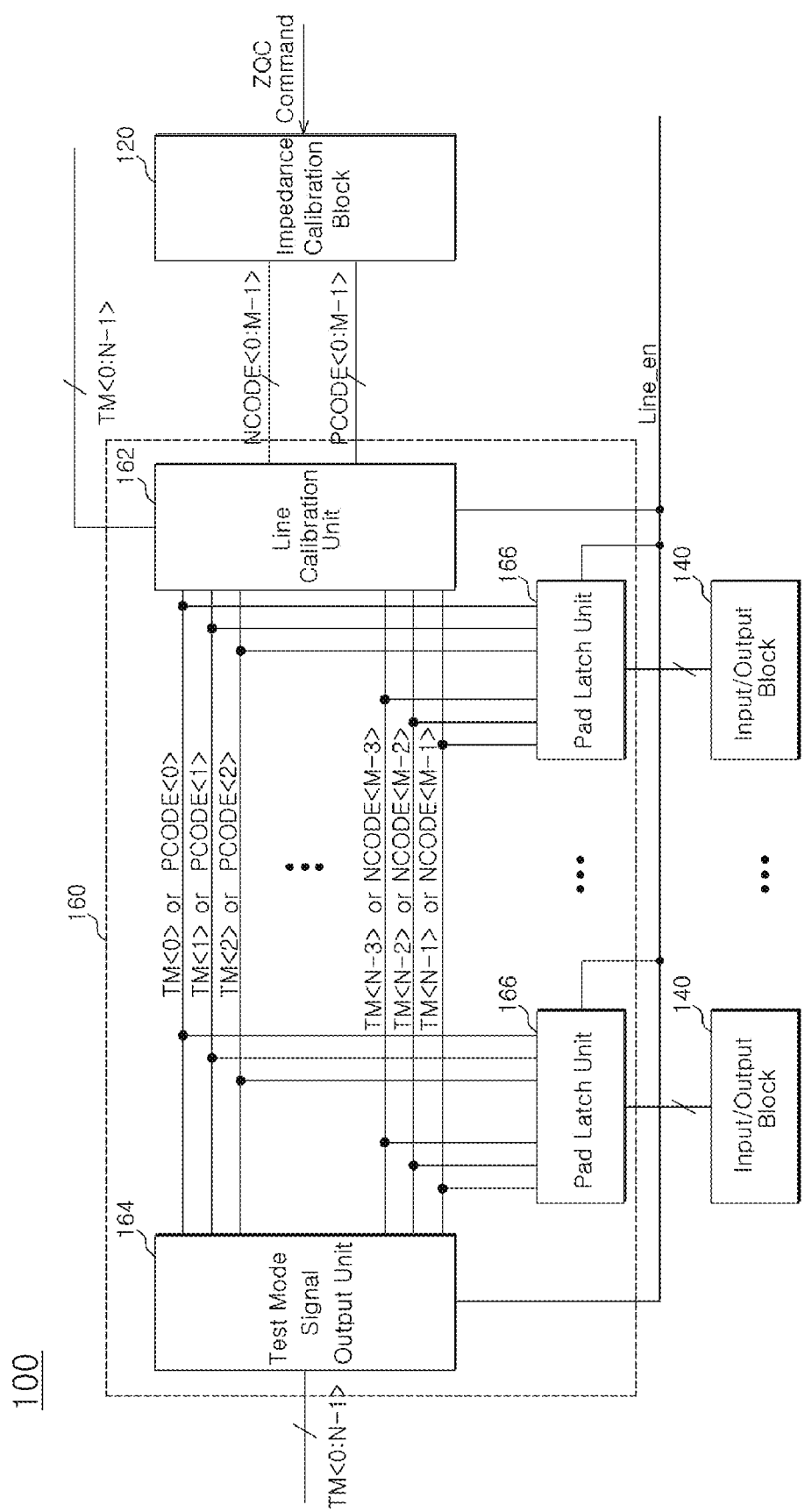
FIG. 2 is a block diagram illustrating a semiconductor memory apparatus according to one embodiment.

FIG. 2 is a block diagram illustrating a semiconductor memory apparatus according to one embodiment of the present invention.

Referring to FIG. 2, the semiconductor memory apparatus 100 according to the embodiment includes an impedance calibration block 120, input/output blocks 140 and a common global line control block 160.

The impedance calibration block 120 is configured to generate a plurality of first code signals PCODE<0:M-1> and a plurality of second code signals NCODE<0:M-1> in response to an inputted impedance command (hereinafter, referred to as a ZQC command).

In detail, the impedance calibration block 120 is configured to generate first code signals PCODE<0:M-1> and second code signals NCODE<0:M-1> at the initial driving time and at predetermined intervals in response to the ZQC command applied from outside of the semiconductor memory apparatus.

The impedance calibration block 120 is configured to calibrate a resistance value of an output terminal such that data signals may be transmitted to a subsequent chip without impedance mismatching.

The input/output block 140 is configured to generate the resistance value of the output terminal based on first code signals PCODE<0:M-1> and second code signals NCODE<0:M-1>, which are provided from the impedance calibration block 120, such that the data signals may be transmitted to the subsequent chip. Typically, such an input/output block 140 includes a resistance generation unit (not shown) and an input/output pad (not shown).

The common global line control block 160 is configured to output one signal among first code signals PCODE<0:M-1>, second code signals NCODE<0:M-1>, and test mode signals TM<0:N-1> in response to a line calibration signal Line_en, which is inputted from outside of the semiconductor memory apparatus 100, to a common global line, and to control the outputted signal to be inputted to a corresponding block.

The common global line control block 160 includes a line calibration unit 162, a test mode signal output unit 164, and a plurality of pad latch units 166.

The line calibration unit 162 is configured to selectively output one signal among the first code signals PCODE<0:M-1> and the second code signals NCODE<0:M-1>, which are provided from the impedance calibration block 120, and the test mode signals TM<0:N-1>, which are provided from test mode lines, to the common global line. In this case, the signals outputted to the common global line are inputted to a corresponding block, that is, the test mode signal output unit 164, or the plurality of pad latch units 166.

In more detail, when the line calibration signal Line_en is at a first level, the line calibration unit 162 activates first code signals PCODE<0:M-1> and second code signals NCODE<0:M-1> to be outputted to the common global line.

Meanwhile, when the line calibration signal Line_en is at a second level, the line calibration unit 162 activates test mode signals TM<0:N-1> to be outputted to the common global line.

Here, the first level represents a low level and the second level represents a high level. However, the first level and the second level are not limited thereto, but may be designed differently. For example, the first level may represent a high level and the second level may represent a low level. The line calibration unit 162 according to an embodiment is described below in detail with reference to FIG. 3.

The test mode signal output unit 164 is configured only to output the test mode signals TM<0:N-1>, which are outputted from the line calibration unit 162, in response to the line calibration signal Line_en.

In more detail, the test mode signal output unit 164 is activated only when test mode signals TM<0:N-1> are inputted among the signals outputted from the line calibration unit 162 (in other words, test mode signals TM<0:N-1>, first code signals PCODE<0:M-1> and second code signals NCODE<0:M-1>). Such a test mode signal output unit 164 is described below in detail with reference to FIG. 4.

The pad latch units 166 are configured to output or latch the first code signals PCODE<0:M-1> and the second code signals NCODE<0:M-1>, which are outputted from the line calibration unit 162, in response to the line calibration signal Line_en.

Here, when the signals outputted from the line calibration unit 162 are the test mode signals TM<0:N-1>, the pad latch units 166 substantially prevent the test mode signals TM<0:N-1> from being inputted, and, at the same time, continuously latch the previously inputted first code signals PCODE<0:M-1> and second code signals NCODE<0:M-1>.

Meanwhile, when the signals outputted from the line calibration unit 162 are the first code signals PCODE<0:M-1> and/or the second code signals NCODE<0:M-1>, the pad latch units 166 are enabled to latch first code signals PCODE<0:M-1> and second code is signals NCODE<0:M-1>, which are contemporaneously inputted, and simultaneously output the first code signals PCODE<0:M-1> and the second code signals NCODE<0:M-1> to the input/output blocks 140. This pad latch unit 166 is described below in detail with reference to FIG. 5.

Figure 3:
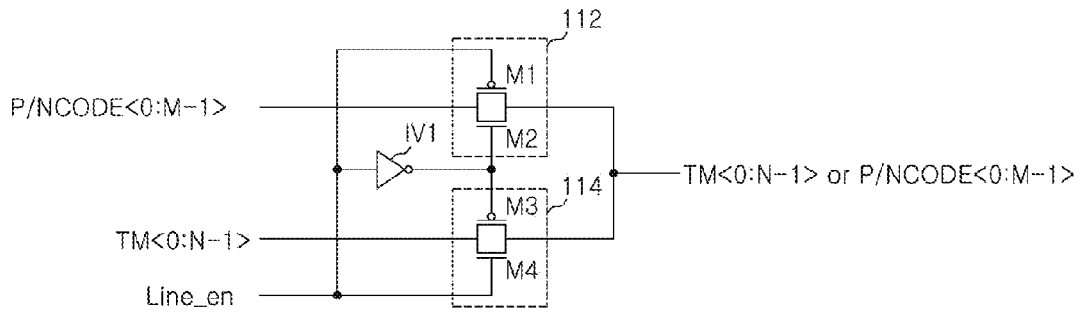
FIG. 3 is a detailed circuit diagram illustrating a line calibration unit in a semiconductor memory apparatus according to one embodiment.

FIG. 3 is a detailed circuit diagram illustrating the line calibration unit in the semiconductor memory apparatus according to one embodiment of the present invention.

Referring to FIG. 3, the line calibration unit 162 in the semiconductor memory apparatus according to one embodiment includes a first switching section 112, which is configured to output the first code signals PCODE<0:M-1> and the second code signals NCODE<0:M-1>, and a second switching section 114, which is configured to output the test mode signals TM<0:N-1>.

The first switching section 112 includes transmission gates M1 and M2, and is activated based on the level of the line calibration signal Line_en inputted from outside of the semiconductor memory apparatus 100, thereby outputting the first code signals PCODE<0:M-1> and the second code signals NCODE<0:M-1>.

In more detail, when the line calibration signal Line_en is inputted at a first level, the first switching section 112 is turned on such that the first code signals PCODE<0:M-1> and the second code signals NCODE<0:M-1> provided from the impedance calibration block 120 are outputted. Here, the first level preferably represents a low level.

The second switching section 114 includes transmission gates M3 and M4, and is activated based on the level of the line calibration signal Line_en, thereby outputting the test mode signals TM<0:N-1>.

In more detail, when the line calibration signal Line_en is inputted at a second level, the second switching section 114 is turned on such that the test mode signals TM<0:N-1> are outputted. Here, the second level preferably represents a high level.

Figure 4:
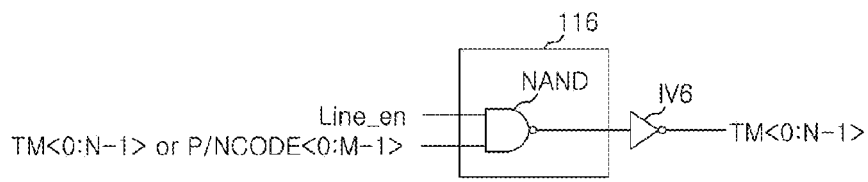
FIG. 4 is a detailed circuit diagram illustrating a test mode signal output unit in a semiconductor memory apparatus according to one embodiment.

FIG. 4 is a detailed circuit diagram illustrating the test mode signal output unit in the semiconductor memory apparatus according to one embodiment.

Referring to FIG. 4, the test mode signal output unit 164 in the semiconductor memory apparatus according to one embodiment is configured to output the test mode signals TM<0:N-1> in response to the line calibration signal Line_en.

To this end, the test mode signal output unit 164 is configured to receive the line calibration signal Line_en and either the test mode signals TM<0:N-1> or the first code signals PCODE<0:M-1> or the second code signals NCODE<0:M-1>. The test mode signal output unit 164 includes a NAND gate NAND 116 configured to output the test mode signals TM<0:N-1> in response to the line calibration signal Line_en.

Figure 5:
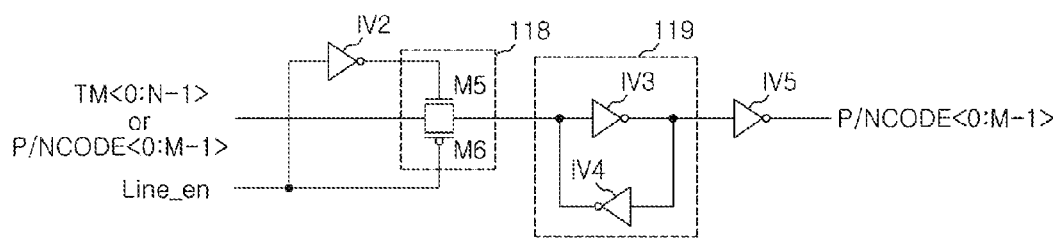
FIG. 5 is a detailed circuit diagram illustrating a pad latch unit in a semiconductor memory apparatus according to one embodiment.

FIG. 5 is a detailed circuit diagram illustrating the pad latch unit in the semiconductor memory apparatus according to one embodiment.

Referring to FIG. 5, the pad latch unit 166 in the semiconductor memory apparatus according to one embodiment includes a third switching section 118 and a latch section 119.

The third switching section 118 includes transmission gates M5 and M6, and is configured to output the first code signals PCODE<0:M-1> and the second code signals NCODE<0:M-1> to the input/output block 140 in response to the level of the line calibration signal Line_en, which is inputted from outside of the semiconductor memory apparatus 100.

In more detail, when the line calibration signal Line_en is at the first level, the third switching section 118 outputs the first code signals PCODE<0:M-1> and the second code signals NCODE<0:M-1>, which are provided from the impedance calibration block 120, to the input/output blocks 140.

Meanwhile, when the line calibration signal Line_en is at the second level, the third switching section 118 is deactivated such that the test mode signals TM<0:N-1> are not inputted thereto.

When the third switching section 118 is deactivated, the latch section 119 continuously stores the values of previously-inputted first code signals PCODE<0:M-1> and second code signals NCODE<0:M-1>. Then, when the third switching section 118 is activated, the latch section 119 latches first code signals PCODE<0:M-1> and second code signals NCODE<0:M-1>, which are contemporaneously inputted, and simultaneously outputs the first code signals PCODE<0:M-1> and the second code signals NCODE<0:M-1> to the input/output blocks 140.

Here, the latch section 119 includes a third inverter IV3, which is configured to receive the values of the first code signals PCODE<0:M-1> and the second code signals NCODE<0:M-1>, and a fourth inverter IV4 connected to the third inverter IV3 using a latch structure.

In the conventional art, since 2M first and second code signal lines and N test mode signal lines (in other words, a total of 2M+N global lines) are used, the ability to reduce the area of a semiconductor memory apparatus is limited.

However, the present invention allows for the reduction in the number of global lines by interchangeably using first code signal lines, second code signal lines, and test mode signal lines. Consequently, the area of the semiconductor memory apparatus according to one embodiment may be reduced.

While certain embodiments are described above, those skilled in the art will understand that such embodiments are examples only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
    a line calibration unit configured to selectively output one signal from the group of code signals for calibrating termination resistance values and test mode signals for testing a chip of the semiconductor memory apparatus to a common global line based on the level of a line calibration signal.

2. The semiconductor memory apparatus according to claim 1, further comprising:
    a pad latch unit configured to receive the code signals, and to latch and output the code signals when the line calibration signal is deactivated.

3. The semiconductor memory apparatus according to claim 2, further comprising:
    an impedance calibration block configured to generate the code signals;
    a test mode determination block connected to the common global line and configured to output the test mode signals when the line calibration signal is activated; and
    an input/output block configured to receive the code signals outputted through the pad latch unit.

4. The semiconductor memory apparatus according to claim 2, wherein the line calibration unit comprises:
    a first switching section configured to be activated to output the code signals when the line calibration signal is at a first level; and
    a second switching section configured to be activated to output the test mode signals when the line calibration signal is at a second level.

5. The semiconductor memory apparatus according to claim 2, wherein the pad latch unit comprises:
    a third switching section configured to be activated to output the code signals based on the level of the line calibration signal; and
    a latch section configured to latch the output of the third switching section.

6. A semiconductor memory apparatus comprising:
    a common global line control block configured to output one signal from the group of code signals and test mode signals to a common global line in response to a line calibration signal inputted from outside of the semiconductor memory apparatus, and to control the signal outputted to the common global line to be inputted to a corresponding block in response to the line calibration signal.

7. The semiconductor memory apparatus according to claim 6, wherein the common global line control block comprises:
    a line calibration unit configured to output one signal from the group of the code signals and the test mode signals to the common global line in response to the line calibration signal;
    a test mode signal output unit configured to output the test mode signals, which are inputted from the common global line, when the line calibration signal is activated; and
    a pad latch unit configured to latch and output the code signals, which are inputted from the common global line, when the line calibration signal is deactivated.

8. The semiconductor memory apparatus according to claim 7, further comprising:
    an impedance calibration block configured to generate the code signals and provide the common global line control block with the is code signals; and
    an input/output block configured to receive the code signals outputted through the pad latch unit.

9. The semiconductor memory apparatus according to claim 7, wherein the line calibration unit comprises:
    a first switching section configured to be enabled to output the code signals when the line calibration signal is at a first level; and
    a second switching section configured to be enabled to output the test mode signals when the line calibration signal is at a second level.

10. The semiconductor memory apparatus according to claim 7, wherein the test mode signal output unit comprises a NAND gate configured to output the test mode signals in response to the line calibration signal.

11. The semiconductor memory apparatus according to claim 8, wherein the pad latch unit comprises:
    a third switching section configured to be activated to output the code signals based on the level of the line calibration signal; and
    a latch section configured to latch the output of the third switching section.

* * * * *